(12) United States Patent
Klein et al.

(10) Patent No.: US 8,193,698 B2
(45) Date of Patent: Jun. 5, 2012

(54) ORGANIC LIGHT EMITTING DIODE AND METHOD FOR PRODUCING AN ORGANIC LIGHT EMITTING DIODE

(75) Inventors: Markus Klein, Tegernheim (DE); Ralph Paetzold, Roth (DE); Wiebke Sarfert, Herzogenaurach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 445 days.

(21) Appl. No.: 11/923,386

(22) Filed: Oct. 24, 2007

(65) Prior Publication Data

US 2008/0100211 A1 May 1, 2008

(30) Foreign Application Priority Data

Oct. 25, 2006 (DE) .................. 10 2006 051 101

(51) Int. Cl.
*H01L 51/10* (2006.01)
(52) U.S. Cl. ....................................... 313/504
(58) Field of Classification Search .............. 313/504, 313/506
See application file for complete search history.

(56) References Cited

U.S. PATENT DOCUMENTS

| | | | | |
|---|---|---|---|---|
| 5,949,186 | A * | 9/1999 | Nagayama et al. | 313/504 |
| 5,962,970 | A * | 10/1999 | Yokoi et al. | 313/506 |
| 6,416,885 | B1 * | 7/2002 | Towns et al. | 428/690 |
| 2002/0179898 | A1 * | 12/2002 | Marks et al. | 257/40 |
| 2004/0061436 | A1 * | 4/2004 | Ogawa et al. | 313/506 |
| 2004/0092195 | A1 | 5/2004 | Marks et al. | |

FOREIGN PATENT DOCUMENTS

| | | |
|---|---|---|
| JP | 6-52991 | 2/1994 |
| JP | 8-273832 | 10/1996 |
| JP | 10-50481 | 2/1998 |
| JP | 10-270173 | 10/1998 |
| JP | 2000-173777 | 6/2000 |
| WO | WO 98/07202 A1 | 2/1998 |
| WO | WO 2004/013920 | 2/2004 |

OTHER PUBLICATIONS

Japan Patent Office, "Translation of the Notification of Reasons for Refusal (type I office action)", JP Pat. Appl. No. 2007-277222, issued on Nov. 25, 2011 (8 pages).

* cited by examiner

*Primary Examiner* — Karabi Guharay

(74) *Attorney, Agent, or Firm* — Fish & Richardson P.C.

(57) ABSTRACT

An organic light-emitting diode includes an organic light-emitting layer located between a transparent electrode and one other electrode on a substrate. In some embodiments at least one of the transparent electrode and the other electrode has two layers. The two layers include a structured layer, which is a charge carrier injection layer, and a conductive second layer into which the first layer is embedded. In some embodiments the organic light-emitting layer includes a structured charge carrier blocking layer.

20 Claims, 3 Drawing Sheets

ORGANIC LIGHT EMITTING DIODE AND METHOD FOR PRODUCING AN ORGANIC LIGHT EMITTING DIODE

BACKGROUND

This application describes structured organic light-emitting diodes (OLEDs) and procedures for the fabrication of structured OLEDs.

The importance of OLEDs and especially the importance of the OLED technology for displays, lighting applications and signage is steadily increasing. Due to their simple and economic processing, OLED components are predestined to represent non-moving, i.e., fixed, constant symbols and labels for identification, signage and visualization. The OLEDs used for this purpose could simply be called "fixed OLEDs", whereby the term "fixed" refers to the stationary, unchanging shape of the illuminating area of the illuminated display and not to any elastic properties of the light-emitting component itself.

In order to enable OLEDs to display symbols or letters in a stationary manner—i.e., to enable structured radiation—requires some modification of the device architecture over a standard device. The illuminating area of the OLED is generally determined by the zone, in which the anode and cathode overlap. By arranging the electrodes accordingly, it becomes possible to create fixed shapes, symbols and text. According to the state of the art, an ITO anode is applied and photolithographically etched and a shadow mask is used during thermal vapor-deposition of the cathode to deposit the cathode in a desired configuration. In view of the simple and economic processing of OLEDs for simple display elements, the photolithographic techniques are not well suited since this procedure requires a large number of processing steps, which make it a complex and time-consuming procedure. In addition, photolithography requires the use of chemicals, which are expensive to purchase and which may damage underlying layers.

SUMMARY

In one embodiment, a structured radiation for an OLED is provided, especially a fixed OLED. Procedures for fabricating an OLED with structured radiation are described.

In one embodiment, an OLED includes a substrate on which an organic light-emitting layer, which is between a transparent electrode and one other electrode, is located. At least one of the transparent electrode or the other electrode has two layers and the two layers have a structured first layer, which is a charge carrier injection layer and a conductive second layer, which is embedded into the first layer. Alternatively or in addition, the organic light-emitting layer includes a structured charge carrier blocking layer.

According one embodiment, a process for the fabrication of an OLED includes applying an organic light-emitting layer to a substrate, where the organic light-emitting layer is located between a transparent electrode and one other electrode. At least one of the transparent electrode or the other electrode is applied in such manner that a structured first layer, which is a charge carrier injection layer, is embedded into a conductive second layer. When the organic light-emitting layer is applied to the substrate, a structured charge carrier blocking layer may be applied as well.

The organic light-emitting layer, the transparent electrode and the other electrode can be applied across the entire area, so that the organic light-emitting layer, the transparent electrode and the other electrode are deposited across the entire substrate.

"Across the entire area" may herein be interpreted to mean that the organic light-emitting layer and/or the electrodes are broadly and coherently applied to the substrate.

In this context "structured" may herein be interpreted to mean that one layer is structured along one dimensional direction or along one dimensional plane of the OLED. The dimensional direction and/or the dimensional plane— wherein the latter may be defined by two dimensional directions—may, for example, run parallel to one main surface of the substrate, to which the organic light-emitting layer and the electrodes are applied. This can mean that the dimensional direction or dimensional plane is perpendicular to the application direction and the sequential direction of the electrodes and the organic light-emitting layer. In other terms, "structured" can mean that along a lateral surface parallel to a surface of the substrate, the structured layer is over multiple regions of the substrate that are also covered by a continuous layer, but is not over other regions of the substrate that are covered by the continuous layer.

"Embedded" may mean that the first layer is at least partially enclosed by the second layer.

Herein, "light" means electromagnetic radiation of ultraviolet to infrared wavelength. The emitted light may especially include visible wavelengths.

The fact that a layer or an element is located or applied "on" or "above" another layer or another element means herein that this one layer or this one element is configured with direct mechanical and/or electric contact to the other layer or the other element. It may further mean that this one layer or this one element is indirectly (not immediately) located on or above the other layer or the other element. Additional layers and/or elements may be configured between one and the other layer.

A continuous layer, as described herein, can describe a layer that has no breaks between portions of the layer.

For this type of OLED it may be possible to configure the electrodes and the organic light-emitting layer from end to end and across the entire area and still achieve structured radiation. Due to the structured radiation, an operating OLED can create a structured luminous impression for a viewer. Structured radiation or a structured impression may, for example, convey information in the form of a picture, a pictogram or a sign. In positive representation, the OLED may emit light in the areas that form the information-containing shape. Alternatively, in a negative representation, the areas of the OLED surrounding the information-containing shape may emit light. The expensive photolithographic structuring mentioned above becomes therefore unnecessary since it may be possible that after the electrodes and/or the organic light-emitting layer have been applied, none of the sections or areas of an electrode and/or sections or areas of the organic light-emitting diode have to be removed from any parts of the substrate.

In the embodiments and figures, equal or equally functioning components are referenced with the number. The elements shown and their dimensional ratios are not true to scale; the sizes and thicknesses of individual layers, components, assemblies and zones may instead have been exaggerated for better representation and/or better understanding.

DETAILED DESCRIPTION

In some embodiments, structured radiation OLEDs are formed by the structured injection of charge carriers from the structured first layer into the organic light-emitting layer. The material of the second layer can inject fewer, i.e., in comparison to the first layer, charge carriers or no charge carriers at all into the organic light-emitting layer. In this context, the second layer may ensure electric contact with the structured first layer, which means that the electrical resistance between the first layer and the second layer at least approximates the characteristics of an ohmic resistance.

In some embodiments the first layer is spatially structured—divided into spatial partitions, for example—wherein the electrode of the first layer is, in contrast, broad and continuous.

In some embodiments, it is the organic emitting layer that is structured, either in addition to an electrode layer being structured or instead of an electrode layer being structured.

Figure 1:
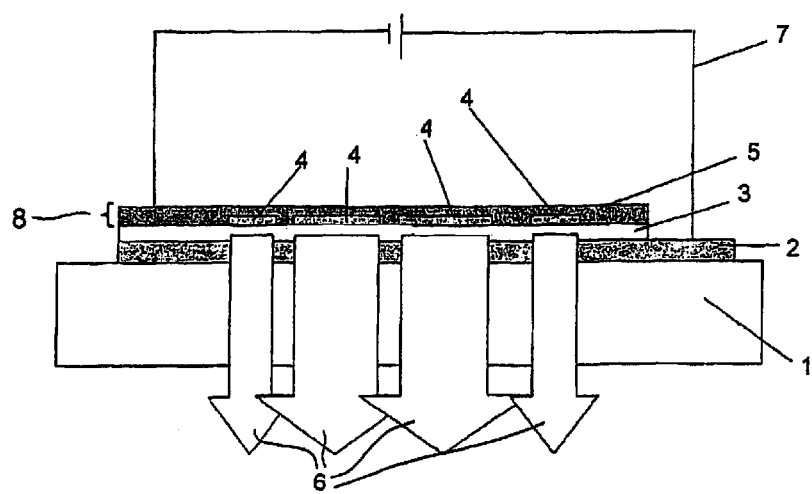
FIGS. 1 to 3B are schematic cross-sectional views of organic light-emitting diodes based on some embodiments.
Figure 4:
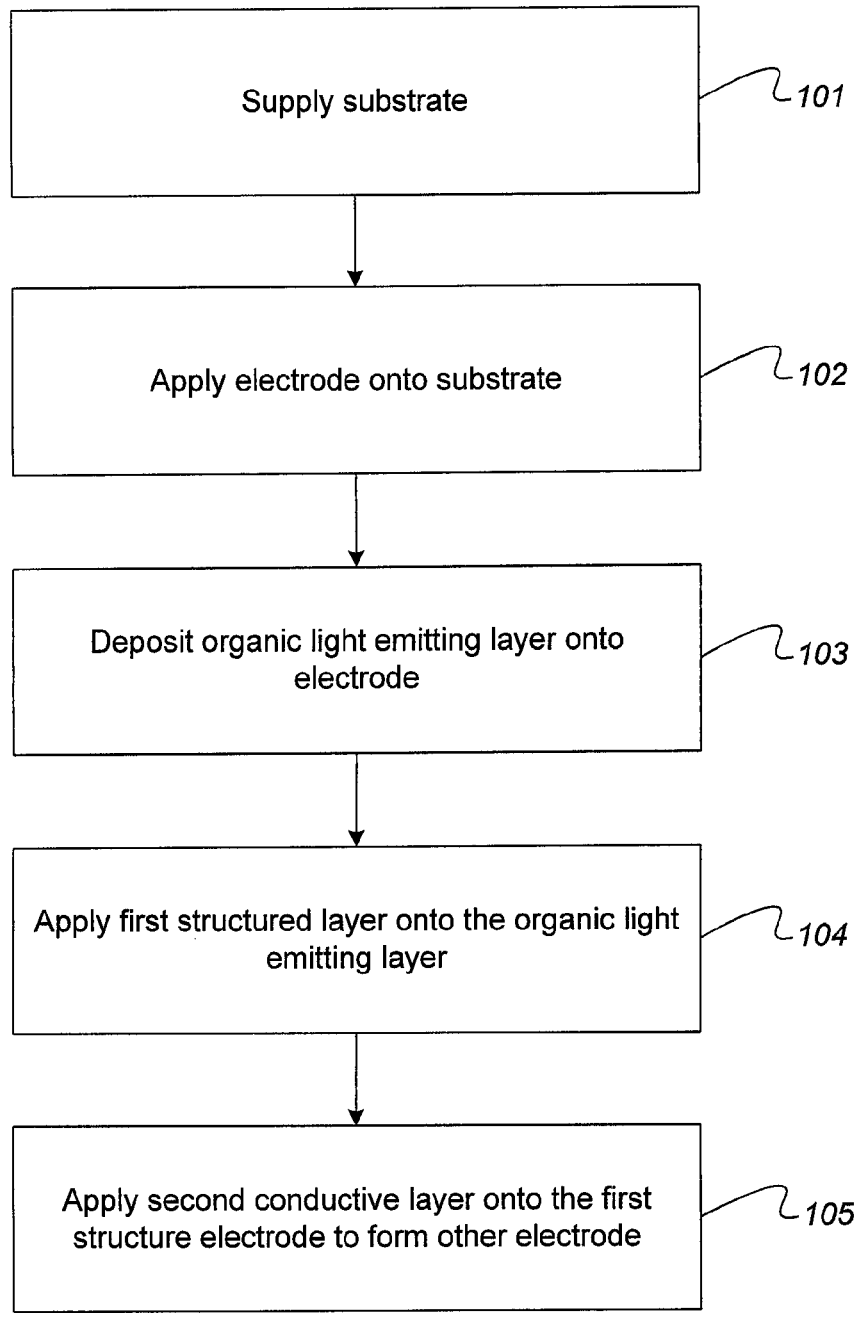
FIG. 4 is a flow diagram of a method for the fabrication of an organic light-emitting diode according to an embodiment.

FIG. 1 shows an embodiment of an OLED designed as a bottom-emitter, which can be produced using the procedure shown in FIG. 4. The process steps referenced with the numbers 101 to 105 described below refer to FIG. 4 while the structural properties of the OLED are shown in FIG. 1.

At the very bottom is the transparent substrate 1, which may be glass, quartz or a flexible foil, and which is supplied in the first process step 101. Substrate 1 may alternatively have multiple layers.

Located on the substrate 1 is an unstructured transparent electrode 2 or anode, which may be made of ITO (indium tin oxide). The transparent electrode 2 is applied broadly in process step 102 onto the main surface of the substrate.

Onto the transparent and unstructured electrode 2, at least one functional organic light-emitting layer 3 is deposited in process step 103. The organic light-emitting layer 3 can have multiple layers and extend along the dimensional plane of the main surface of the substrate 1 broadly and continuously. In some embodiments, the organic light-emitting layer 3 is substantially coextensive with the electrode 2. Electrode 2 can extend just far enough past an end of the organic light-emitting layer 3 to provide a location for making an electrical contact with the electrode. The functional organic light-emitting layer 3 radiates light, which the OLED can emit in the direction of the arrows 6, because the electrode 2 is transparent.

The first structured layer 4 of the other electrode 8 (configured as a back electrode) is applied in another process step 104 to the functional organic light-emitting layer 3 or layers. The structuring of the structured first layer 4 can be created during the vapor depositing of materials such as Ba, Mg, Ca, LiF, CsF, $CS_2CO_3$ with simple shadow masks. In process step 105, a second conductive layer 5 of the other electrode 8 is applied to this layer in the form of a conductive top layer using simple deposition methods such as spincoating, squeegee-coating, spraying, silk-screening, etc. The second layer 5, which is configured as a top layer, embeds the first layer 4 of the back electrode so that the first layer 4 of the back electrode 8 is protected from corrosion.

Lead 7 contacts the lower transparent electrode 2 and the other electrode 8. The component can also include an encapsulation, which for reasons of simplicity is not shown in FIG. 1.

From the first layer 4, electrons can be easily injected into the organic light-emitting layer 3, where they are able to recombine with holes injected from the transparent electrode 2 into the organic light-emitting layer 3 and cause light emission. The light can be emitted from the areas below the first layer 4, so that the OLED is able to emit a luminous image matching the structure of the first structured layer 4.

In comparison to the described conventional process, the proposed structuring process has the advantage that photolithography is not required, resulting in savings of time and money. In contrast to the special masks used in photolithography, the shadow masks used in the vapor depositing process are low-priced and simple to make. Simple structures, shapes and symbols as well as scripts can be realized especially easily and economically with the use of shadow masks. This provides special competitive advantages for OLEDs in applications such as luminescent fixed displays for signage and identifications.

Described in this embodiment is an OLED with a structured back electrode and a fabrication method for an OLED with a structured back electrode, wherein the back electrode includes at least two layers: a first structured, electron-injecting layer, that is thin layer, which is embedded into a second conductive and thicker layer. In this case it is usually not necessary to structure the anode.

Alternatively, the transparent electrode 2 can be a cathode, and the other electrode 8 can be an anode. The other electrode 8 can be transparent, so that the OLED can be configured as a top-emitter.

Figure 2:
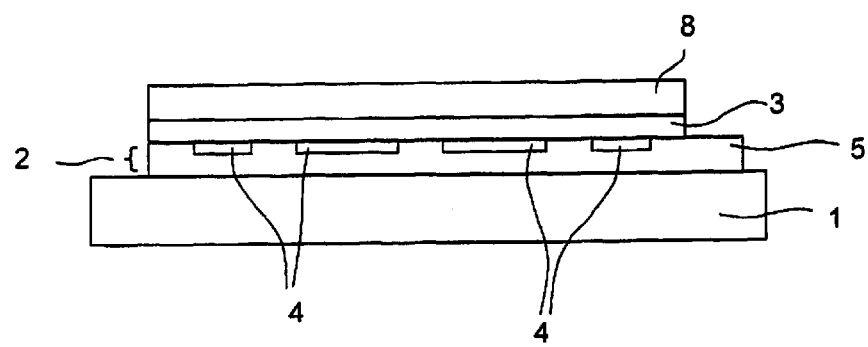

FIG. 2 shows another embodiment for an OLED. Following is a description of the specific differences to the previous embodiment.

The OLED shown in FIG. 2 has on the substrate 1 a transparent electrode 2 with a second layer 5, into which the first layer 4 is embedded. For this purpose, the second layer 5 can be deposited onto the substrate, and the first layer 4 can be created by structured doping in the second layer 5. The doping can result in an easier injection of charge carriers into the organic light-emitting layer 3 or can even allow the injection of charge carriers into the organic light-emitting layer 3 where injection would not occur with the second layer 5 alone. Deposited above the organic light-emitting layer 3 is another continuous electrode 8.

An OLED having a combination of the back electrode 8 from FIG. 1 and the transparent electrode 2 from FIG. 2 is optionally possible as well.

Figure 3A:
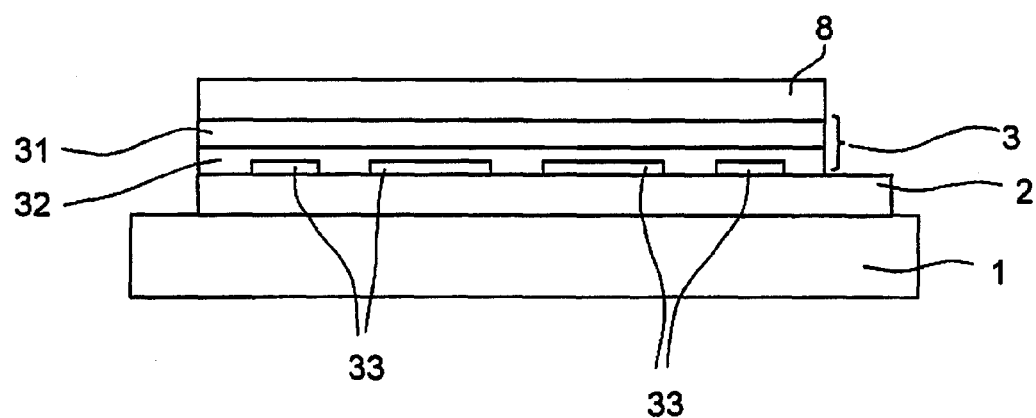

FIG. 3A shows another embodiment of an OLED having two continuously applied electrodes—in particular one transparent electrode 2, which is configured as an anode—and one other electrode 8, which is configured as cathode.

Located between the electrodes is an organic light-emitting layer 3 having a stack of layers with broadly applied organic layers 31 and 32 and a structured charge carrier blocking layer 33. In the embodiment shown, the organic layer 32 is a hole transportation layer, which is applied on top of the structured hole blocking layer 33. This causes holes being injected only into those areas of the organic light-emitting layer 3 where the hole transportation layer 32 borders on the transparent electrode 2.

The organic layer 31 is configured as an electron transport layer, so that electrons and holes can recombine at the boundary surface between the organic layers 31 and 32 and emit light.

Alternatively or in addition to the shown embodiment, the structured hole blocking layer 33 may also extend up to the boundary surface between the layers 31 and 32 or may even extend into the electron transport layer 31. Furthermore, instead of the hole blocking layer 33 shown here, an electron blocking layer can be embedded into the electron transport layer 31.

Figure 3B:
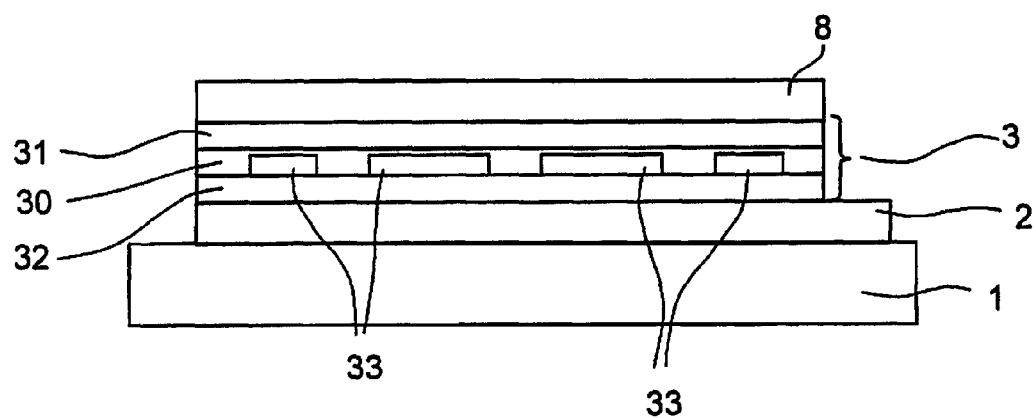

FIG. 3B shows an additional embodiment of an OLED, which, in contrast to the OLED from the sample embodiment pursuant to FIG. 3A, has an organic light-emitting layer 3 comprising the electron transport layer 31 and a hole transport layer 32 with an electroluminescent layer 30 between them. In the electro-luminescent layer 30 electrons and holes, which are injected into the organic light-emitting layer 3 from the electrodes 2 and 8, can recombine and emit light. A structured charge carrier blocking layer 33 configured as an electron and hole blocking layer, is embedded into the electroluminescent layer 30, so that the recombination is able to occur only in those areas in which no charge carrier blocking layer 33 is present, meaning that a structured radiation and/or a structured luminous impression of the OLED can be achieved.

In the above embodiments, the structured layer includes one layer that is not coextensive with the other layer.

In some embodiments the organic light-emitting layer includes a stack of layers, which includes one or multiple of the following layers configured one on top of the other: a hole injection layer, a hole transportation layer, an electron blocking layer, a electric luminescence layer, a hole blocking layer, an electron transportation layer, and an electron injection layer. In particular, these layers can be applied all across the substrate. One of the transparent electrode or the other electrode can inject electrons into the organic light-emitting layer while the other of the transparent electrode the other electrode is able to inject of holes. The electrons and the holes can then recombine in an active zone of the organic light-emitting layer, resulting in the emission of light. The active zone can be formed by a boundary surface between a hole transportation layer and an electron transportation layer or by an electric luminescence layer.

The substrate may, for example, comprise glass, quartz, plastic foils, metal, metal foils, silicon wafers or another suitable substrate material, or be made entirely of such a material. If the OLED is configured as a so-called "bottom emitter", i.e., the light generated in the organic light-emitting layer is emitted through the substrate, then the substrate can be transparent to at least part of the emitted light.

In the bottom-emitter configuration, the transparent electrode can be located on the side of the organic light-emitting layer facing the substrate. The transparent electrode can be an anode, and can therefore be used as hole-injecting material. It can contain a transparent conductive oxide or be made of a transparent conductive oxide. Transparent conductive oxides (in short, "TCOs") are transparent, conductive materials—usually metal oxides—such as zinc oxide, tin oxide, cadmium oxide, titanium oxide, indium oxide, or indium-tin-oxide (ITO). In addition to binary metal-oxygen compounds, such as $ZnO$, $SnO_2$ or $In_2O_3$, ternary metal-oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or combinations of different transparent conductive oxides are also part of the TCO group. TCOs furthermore do not necessarily have a stoichiometric composition and may also be p- or n-doped. Alternatively or in addition, the transparent electrode may also exhibit at least one transparent metal coating. A metal coating can be transparent if its thickness is smaller or equal to 100 nm, such as smaller or equal to 50 nm or smaller or equal to 20 nm.

The other electrode can be a cathode and thus be used as electron-injecting material. In addition or alternatively, the other electrode can also be transparent. This means in particular that the OLED may also be configured as a "top emitter". It is also possible for the transparent electrode to be a cathode and the other electrode to be an anode.

The subject of at least some embodiments is an OLED with at least one transparent substrate, a transparent electrode, an organic light-emitting layer and above it as the other electrode a structured back electrode. The other electrode, which is configured as a structured back electrode, has a minimum of two layers, one first structured layer being the injection layer for the electrons, and a second conductive layer into which the first layer is embedded. The fabrication of the OLED can include steps of forming on the transparent substrate a transparent electrode and at least one organic light-emitting layer and another electrode in the form of a two-layered back electrode. The first layer is applied in a structured manner and embedded into a conductive second layer. In this case, the back electrode may indicate the electrode located on a side of the organic light-emitting layer facing away or furthest from the substrate. In some embodiments, the back electrode (especially its second layer) reflects light that is generated inside the organic light-emitting layer.

In an advantageous embodiment, the transparent electrode is applied not in a structured manner but in a laminar manner using simple depositing methods, which can save processing costs. This can allow the cost-efficient manufacture of the other electrode as a back electrode.

Alternatively, the transparent electrode may also be configured as a back electrode with the other electrode being located on the side of the organic light-emitting layer closest to the substrate. In this case, the transparent electrode has a structured first layer and a conductive second layer. Furthermore, the transparent electrode can be an injection layer for electrons.

Furthermore, the other electrode may also be transparent and/or the transparent electrode may have at least two layers, of which one structured first layer is embedded into a second layer.

In some embodiments, the structured first layer has a thickness of less or equal to 12 nm, especially of less or equal to 7 nm and especially preferred of less or equal to 5 nm.

According to some embodiments, the material of the structured first layer is selected from the following group of materials: barium (Ba), calcium (Ca), Mg, lithium fluoride (LiF) and/or cesium fluoride (CsF), cesium carbonate as well as other carbonates and fluorides of any combinations of these materials. Such materials may be used especially as electron injectors. The first structured layer may also be made of an organic material. The structured first layer may furthermore be made of a hole-injecting material like one of the above-mentioned transparent conductive oxides.

The first layer may furthermore be doped, such as $p^+$-, $n^+$- or $p^++n^+$-doped, such as by as volume and/or boundary surface doping. The first layer can be doped and spatially structured as described herein.

The first layer can include the same material as the second layer, for example TCO or an organic material, and the first layer can be a doped version of this same material. This allows the material for the first and the second layer to be applied at the same time and across the entire substrate and afterwards the doping can be used to create the first layer embedded into the second layer.

In an advantageous embodiment of the procedure, the first structured layer is deposited in a structured manner by thermal vapor deposition using shadow masks.

According to other advantageous embodiments of the procedure, the first layer is created by any other structuring application method of choice. Depending on the material, embossing or imprinting methods can also be used.

The second layer can be applied unstructured because it will be embedded into the first structured layer. This second layer can also be used for contacting the first layer and as its protection against corrosive damage.

According to an advantageous embodiment of the procedure—in the case of the back electrode with the first and the second layer—the second layer is applied to the first structured layer using simple depositing methods in the form of a thicker layer of conductive material. If the electrode is located on the substrate, the second layer can be deposited onto the substrate prior to the first layer, and the first layer can be embedded into the second layer.

According to one embodiment, the second layer is a layer of metal, which is vapor-deposited in unstructured form, and which has a greater thickness than the first layer. Minor structuring and shadow masks can be used to create the ITO contacts.

According to an advantageous embodiment, the thickness of the second layer ranges from 50 to 300 nm, such as from 70 to 250 nm or from 100 to 200 nm.

According to an advantageous embodiment of the invention, the material of the second thicker layer is selected from the group of following materials: aluminum (Al), silver (Ag), and any mixtures or alloys thereof. The second conductive layer may also be made of an organic material.

The materials and the configuration of the transparent electrode and the other electrode, according to the statements above, may be selected such that the structuring of an electrode made from a TCO, such as an ITO anode, for example, is not required.

In another embodiment, the organic light-emitting layer may have a structured charge carrier blocking layer, which can be an electron barrier, a hole barrier, or a barrier layer for electrons and holes.

The transparent electrode and the other electrode can be broad and unstructured, or structured as in one of the above-described embodiments.

For example, at least one of the transparent electrode and the other electrode can be structured in one of the above-described manner, and the charge carrier blocking layer in the organic light-emitting layer can be inside those layers, in which the structured first layer is not present.

The charge carrier blocking layer, for example, may be located at a boundary surface between the organic light-emitting layer and one of the electrodes, and can be embedded in the organic light-emitting layer via an additional organic layer. Furthermore, the structured charge carrier blocking layer can be enclosed by organic layers, so that the charge carrier blocking layer is located inside the organic light-emitting layer.

The structured charge carrier blocking layer can be a hole blocking layer, which is located between an electrode that is designed as an anode, and an active, light-generating area of the organic light-emitting layer. The structured charge carrier blocking layer can prevent holes that are injected by the anode into the organic light-emitting layer from reaching the active, light-generating area.

Alternatively or in addition, the structured charge carrier blocking layer can also be an electrode barrier layer, located between an electrode designed as a cathode and an active, light-generating area of the organic light-emitting layer.

The structured charge carrier blocking layer can also be used to selectively "turn off" individual colors in an organic light-emitting layer that emits multiple colors. For example, this can be possible if the organic light-emitting layer has multiple, extensive, areas on top of each other that radiate multiple colors, i.e., a stack of broadly applied organic layers exhibiting active areas one upon the other. The structured charge carrier blocking layer can be used to partially prevent specific recombinations of holes and electrons in the stacked active zones. As a result, a multi-colored structured light-impression can be generated for the viewer, even though the organic light-emitting layer and the stacked active layers have all been applied broadly and continuously to the substrate.

The structured OLED display elements in accordance to the invention were produced using the described mask process and function very well.

The description of the invention based on the embodiments does not limit the invention to said embodiments. The invention rather includes any new feature as well as any combination of features, especially including any combination of features in the patent claims, even if this feature or this combination itself is not explicitly indicated in the patent claims or sample embodiments.

The invention claimed is:

1. An organic light-emitting diode (OLED), comprising:
a substrate, and
an organic light-emitting layer between a transparent first electrode and a second electrode, wherein the organic light-emitting layer is on the substrate, wherein at least the transparent first electrode has two layers, and the two layers are comprised of a structured first layer being a charge carrier injection layer, and a conductive second layer in which the first layer is embedded, and wherein the first layer is between the conductive second layer and the organic light-emitting layer, wherein:
the substrate is transparent; and
the second electrode is a back electrode and the back electrode is structured and has at least two layers, wherein a further first structured layer is an injection layer for electrons and is embedded in a further conductive second layer.

2. The OLED according to claim 1, wherein the transparent first electrode is located between the organic light-emitting layer and the substrate.

3. The OLED according to claim 1, wherein the transparent first electrode is an anode and the second electrode is a cathode.

4. The OLED according to claim 1, wherein the transparent first electrode is a cathode and the second electrode is an anode.

5. The OLED according to claim 1, wherein the structured first layer has a thickness of less or equal to 12 nm.

6. The OLED according to claim 1, wherein the material of the structured first layer is selected from the following group of materials: barium (Ba), magnesium (Mg), calcium (Ca), carbonate, fluoride, lithium fluoride (LiF), cesium carbonate, cesium fluoride (CsF) and any combination of these materials.

7. The OLED according to claim 1, wherein the conductive second layer is a layer of conductive material having a greater thickness than the structured first layer.

8. The OLED according to claim 7, wherein the conductive second layer is a layer of vapor-deposited metal.

9. The OLED according to claim 1, wherein the conductive second layer has a thickness of 50 to 300 nm.

10. The OLED according to claim 1, wherein the material of the further conductive second layer is selected from the following group of materials: aluminum (Al), silver (Ag) as well as any combinations or alloys thereof.

11. The OLED according to claim 1, wherein the organic light-emitting layer includes a layer stack with at least one of the following layers: a hole injection layer, a hole transport layer, an electron blocking layer, an electron luminescence layer, a hole blocking layer, an electron transport layer, or an electron injection layer.

12. The OLED according to claim 1, wherein the organic light-emitting layer, the transparent first electrode and the second electrode are continuous across the entire substrate.

13. The OLED according to claim 1, wherein the operation of the OLED creates a structured luminous impression for the viewer.

14. The OLED according to claim 1,
wherein the organic light-emitting layer comprises one structured charge carrier blocking layer.

15. The OLED according to claim 14, wherein the charge carrier blocking layer is in contact to one of the first and the second electrode.

16. The OLED according to claim 14, wherein:
the organic light-emitting layer comprises at least two organic layers; and
the structured charge carrier blocking layer extends up to a boundary surface between the at least two organic layers.

17. The OLED according to claim 14, wherein:
the organic light-emitting layer comprises a plurality of organic layers; and
the structured charge carrier blocking layer is embedded into one of the plurality of organic layers.

18. A method for fabrication of an organic light-emitting diode (OLED), comprising:
applying an organic light-emitting layer to a substrate, wherein the organic light-emitting layer is located between a transparent first electrode and a broadly applied second electrode; and
applying at least the transparent first electrode such that a structured first layer, being a charge carrier injection layer, is embedded into a conductive second layer, and wherein the first layer is between the conductive second layer and the organic light-emitting layer, wherein the substrate is transparent, the organic active light-emitting layer is between the second electrode and the substrate, the second electrode includes a further structured first layer embedded into a further conductive second layer.

19. The method according to claim 18, wherein the first layer is applied in a structured manner by vapor depositing through a shadow mask.

20. The method according to claim 18, wherein the first structured layer is an injection layer for electrons and is deposited in a structured manner during vapor-depositing using at least one shadow mask.

* * * * *

UNITED STATES PATENT AND TRADEMARK OFFICE
CERTIFICATE OF CORRECTION

| | | |
|---|---|---|
| PATENT NO. | : 8,193,698 B2 | Page 1 of 1 |
| APPLICATION NO. | : 11/923386 | |
| DATED | : June 5, 2012 | |
| INVENTOR(S) | : Markus Klein, Ralph Paetzold and Wiebke Sarfert | |

It is certified that error appears in the above-identified patent and that said Letters Patent is hereby corrected as shown below:

ON THE TITLE PAGE:

Item (75) INVENTORS, column 1, line 1, delete "Tegemheim" and insert -- Tegernheim --.

Signed and Sealed this
Seventh Day of August, 2012

David J. Kappos
*Director of the United States Patent and Trademark Office*